United States Patent
Tao et al.

(10) Patent No.: US 9,094,027 B2
(45) Date of Patent: Jul. 28, 2015

(54) MICRO-ELECTRO-MECHANICAL-SYSTEM (MEMS) DRIVER

(71) Applicant: Fairchild Semiconductor Corporation, San Jose, CA (US)

(72) Inventors: Hai Tao, Sunnyvale, CA (US); Ion Opris, San Jose, CA (US)

(73) Assignee: Fairchild Semiconductor Corporation, San Jose, CA (US)

(*) Notice: Subject to any disclaimer, the term of this patent is extended or adjusted under 35 U.S.C. 154(b) by 32 days.

(21) Appl. No.: 13/860,761

(22) Filed: Apr. 11, 2013

(65) Prior Publication Data

US 2013/0271228 A1    Oct. 17, 2013

Related U.S. Application Data

(60) Provisional application No. 61/623,407, filed on Apr. 12, 2012.

(51) Int. Cl.
 *H03B 5/30* (2006.01)
 *G01C 19/5656* (2012.01)
 (Continued)

(52) U.S. Cl.
 CPC ............ *H03L 7/183* (2013.01); *G01C 19/5656* (2013.01); *G01C 19/5776* (2013.01); *H03B 5/30* (2013.01); *H03H 2009/02283* (2013.01)

(58) Field of Classification Search
 CPC ........ G01C 19/00; G01C 19/02; G01C 19/04; G01C 19/42; G01C 19/56; G01C 19/5607; G01C 19/5621; G01C 19/5656; G01C 19/5684; G01C 19/5712; G01C 19/5719; G01C 19/5776; G01P 15/097; G01P 15/18; H03B 5/30; H03B 5/32; H03B 5/36; H03B 5/364; H03B 5/366; H03H 2009/02244; H03H 2009/02283; H03L 7/183

USPC .................. 73/1.38, 504.02–504.04, 504.12; 331/116 FE, 116 M, 116 R, 154; 702/104

See application file for complete search history.

(56) References Cited

U.S. PATENT DOCUMENTS

| | | | |
|---|---|---|---|
| 4,896,156 A | 1/1990 | Garverick | |
| 5,487,305 A | 1/1996 | Ristic et al. | |

(Continued)

FOREIGN PATENT DOCUMENTS

| | | | |
|---|---|---|---|
| CN | 1389704 A | 1/2003 | |
| CN | 1816747 A | 8/2006 | |

(Continued)

OTHER PUBLICATIONS

"U.S. Appl. No. 12/849,742, Supplemental Notice of Allowability mailed Mar. 17, 2014", 3 pgs.

(Continued)

*Primary Examiner* — Levi Gannon
(74) *Attorney, Agent, or Firm* — Schwegman Lundberg & Woessner, P.A.

(57) ABSTRACT

In an example, a driver for a micro-electro-mechanical-system (MEMS) device can include a first input configured to receive a first command signal including an oscillatory command signal, a second input configured to receive a second command signal including a bias command signal, and an amplifier configured to receive a high voltage supply, to provide, to the MEMS device, a closed-loop output signal responsive to both the first command signal and the second command signal in a first state, and to provide an open loop output signal configured to substantially span a voltage range of the high voltage supply in a second state.

23 Claims, 4 Drawing Sheets

(51) Int. Cl.
  *H03L 7/183* (2006.01)
  *G01C 19/5776* (2012.01)
  *H03H 9/02* (2006.01)

(56) References Cited

U.S. PATENT DOCUMENTS

| | | | |
|---|---|---|---|
| 5,491,604 A * | 2/1996 | Nguyen et al. | 361/278 |
| 5,600,064 A | 2/1997 | Ward | |
| 5,723,790 A | 3/1998 | Andersson | |
| 5,751,154 A | 5/1998 | Tsugai | |
| 5,760,465 A | 6/1998 | Alcoe et al. | |
| 5,765,046 A | 6/1998 | Watanabe et al. | |
| 6,131,457 A | 10/2000 | Sato | |
| 6,214,644 B1 | 4/2001 | Glenn | |
| 6,301,965 B1 | 10/2001 | Chu et al. | |
| 6,351,996 B1 | 3/2002 | Nasiri et al. | |
| 6,366,468 B1 | 4/2002 | Pan | |
| 6,390,905 B1 | 5/2002 | Korovin et al. | |
| 6,501,282 B1 | 12/2002 | Dummermuth et al. | |
| 6,504,385 B2 | 1/2003 | Hartwell | |
| 6,553,835 B1 | 4/2003 | Hobbs et al. | |
| 6,722,206 B2 | 4/2004 | Takada | |
| 6,725,719 B2 | 4/2004 | Cardarelli | |
| 6,781,231 B2 | 8/2004 | Minervini et al. | |
| 6,848,304 B2 | 2/2005 | Geen | |
| 7,051,590 B1 | 5/2006 | Lemkin et al. | |
| 7,054,778 B2 | 5/2006 | Geiger et al. | |
| 7,093,487 B2 | 8/2006 | Mochida | |
| 7,166,910 B2 | 1/2007 | Minervini et al. | |
| 7,202,552 B2 | 4/2007 | Zhe et al. | |
| 7,210,351 B2 | 5/2007 | Lo et al. | |
| 7,221,767 B2 | 5/2007 | Mullenborn et al. | |
| 7,240,552 B2 | 7/2007 | Acar et al. | |
| 7,258,011 B2 | 8/2007 | Nasiri et al. | |
| 7,258,012 B2 | 8/2007 | Xie et al. | |
| 7,266,349 B2 * | 9/2007 | Kappes | 455/73 |
| 7,293,460 B2 | 11/2007 | Zarabadi et al. | |
| 7,301,212 B1 | 11/2007 | Mian et al. | |
| 7,305,880 B2 * | 12/2007 | Caminada et al. | 73/504.04 |
| 7,358,151 B2 | 4/2008 | Araki et al. | |
| 7,436,054 B2 | 10/2008 | Zhe | |
| 7,449,355 B2 | 11/2008 | Lutz et al. | |
| 7,451,647 B2 | 11/2008 | Matsuhisa et al. | |
| 7,454,967 B2 | 11/2008 | Skurnik | |
| 7,518,493 B2 | 4/2009 | Bryzek et al. | |
| 7,539,003 B2 | 5/2009 | Ray | |
| 7,544,531 B1 | 6/2009 | Grosjean | |
| 7,595,648 B2 | 9/2009 | Ungaretti et al. | |
| 7,600,428 B2 | 10/2009 | Robert et al. | |
| 7,616,078 B2 * | 11/2009 | Prandi et al. | 333/186 |
| 7,622,782 B2 | 11/2009 | Chu et al. | |
| 7,706,149 B2 | 4/2010 | Yang et al. | |
| 7,781,249 B2 | 8/2010 | Laming et al. | |
| 7,795,078 B2 | 9/2010 | Ramakrishna et al. | |
| 7,859,352 B2 * | 12/2010 | Sutton | 331/160 |
| 7,950,281 B2 | 5/2011 | Hammerschmidt | |
| 8,004,354 B1 * | 8/2011 | Pu et al. | 330/86 |
| 8,006,557 B2 | 8/2011 | Yin et al. | |
| 8,037,755 B2 * | 10/2011 | Nagata et al. | 73/504.04 |
| 8,113,050 B2 | 2/2012 | Acar et al. | |
| 8,171,792 B2 | 5/2012 | Sameshima | |
| 8,201,449 B2 | 6/2012 | Ohuchi et al. | |
| 8,250,921 B2 | 8/2012 | Nasiri et al. | |
| 8,375,789 B2 * | 2/2013 | Prandi et al. | 73/504.12 |
| 8,421,168 B2 | 4/2013 | Allen et al. | |
| 8,476,970 B2 | 7/2013 | Mokhtar et al. | |
| 8,508,290 B2 | 8/2013 | Elsayed et al. | |
| 8,710,599 B2 | 4/2014 | Marx et al. | |
| 8,739,626 B2 | 6/2014 | Acar | |
| 8,742,964 B2 | 6/2014 | Kleks et al. | |
| 8,754,694 B2 | 6/2014 | Opris et al. | |
| 8,813,564 B2 | 8/2014 | Acar | |
| 2002/0021059 A1 | 2/2002 | Knowles et al. | |
| 2002/0117728 A1 | 8/2002 | Brosnihan et al. | |
| 2002/0178831 A1 | 12/2002 | Takada | |
| 2002/0189352 A1 | 12/2002 | Reeds, III et al. | |
| 2002/0196445 A1 * | 12/2002 | McClary et al. | 356/475 |
| 2003/0038415 A1 | 2/2003 | Anderson et al. | |
| 2003/0061878 A1 | 4/2003 | Pinson | |
| 2003/0200807 A1 | 10/2003 | Hulsing, II | |
| 2003/0222337 A1 | 12/2003 | Stewart | |
| 2004/0085784 A1 * | 5/2004 | Salama et al. | 363/25 |
| 2004/0119137 A1 | 6/2004 | Leonardi et al. | |
| 2004/0177689 A1 | 9/2004 | Cho et al. | |
| 2004/0211258 A1 | 10/2004 | Geen | |
| 2004/0219340 A1 | 11/2004 | McNeil et al. | |
| 2004/0231420 A1 | 11/2004 | Xie et al. | |
| 2004/0251793 A1 | 12/2004 | Matsuhisa | |
| 2005/0005698 A1 | 1/2005 | McNeil et al. | |
| 2005/0097957 A1 | 5/2005 | Mcneil et al. | |
| 2005/0139005 A1 | 6/2005 | Geen | |
| 2005/0189635 A1 | 9/2005 | Humpston et al. | |
| 2005/0274181 A1 | 12/2005 | Kutsuna et al. | |
| 2006/0032308 A1 | 2/2006 | Acar et al. | |
| 2006/0034472 A1 | 2/2006 | Bazarjani et al. | |
| 2006/0043608 A1 | 3/2006 | Bernier et al. | |
| 2006/0097331 A1 | 5/2006 | Hattori | |
| 2006/0137457 A1 | 6/2006 | Zdeblick | |
| 2006/0207328 A1 | 9/2006 | Zarabadi et al. | |
| 2006/0213265 A1 | 9/2006 | Weber et al. | |
| 2006/0213266 A1 | 9/2006 | French et al. | |
| 2006/0213268 A1 | 9/2006 | Asami et al. | |
| 2006/0246631 A1 | 11/2006 | Lutz et al. | |
| 2007/0013052 A1 | 1/2007 | Zhe et al. | |
| 2007/0034005 A1 | 2/2007 | Acar et al. | |
| 2007/0040231 A1 | 2/2007 | Harney et al. | |
| 2007/0042606 A1 | 2/2007 | Wang et al. | |
| 2007/0047744 A1 | 3/2007 | Karney et al. | |
| 2007/0071268 A1 | 3/2007 | Harney et al. | |
| 2007/0085544 A1 | 4/2007 | Viswanathan | |
| 2007/0099327 A1 | 5/2007 | Hartzell et al. | |
| 2007/0114643 A1 | 5/2007 | DCamp et al. | |
| 2007/0165888 A1 | 7/2007 | Weigold | |
| 2007/0205492 A1 | 9/2007 | Wang | |
| 2007/0220973 A1 | 9/2007 | Acar | |
| 2007/0222021 A1 | 9/2007 | Yao | |
| 2007/0284682 A1 | 12/2007 | Laming et al. | |
| 2008/0049230 A1 | 2/2008 | Chin et al. | |
| 2008/0081398 A1 | 4/2008 | Lee et al. | |
| 2008/0083958 A1 | 4/2008 | Wei et al. | |
| 2008/0083960 A1 | 4/2008 | Chen et al. | |
| 2008/0092652 A1 | 4/2008 | Acar | |
| 2008/0122439 A1 | 5/2008 | Burdick et al. | |
| 2008/0157238 A1 | 7/2008 | Hsiao | |
| 2008/0157301 A1 | 7/2008 | Ramakrishna et al. | |
| 2008/0169811 A1 | 7/2008 | Viswanathan | |
| 2008/0202237 A1 | 8/2008 | Hammerschmidt | |
| 2008/0245148 A1 | 10/2008 | Fukumoto | |
| 2008/0247585 A1 | 10/2008 | Leidl et al. | |
| 2008/0251866 A1 | 10/2008 | Belt et al. | |
| 2008/0290756 A1 | 11/2008 | Huang | |
| 2008/0302559 A1 | 12/2008 | Leedy | |
| 2008/0314147 A1 | 12/2008 | Nasiri | |
| 2009/0064780 A1 | 3/2009 | Coronato et al. | |
| 2009/0072663 A1 * | 3/2009 | Ayazi et al. | 310/320 |
| 2009/0140606 A1 | 6/2009 | Huang | |
| 2009/0166827 A1 | 7/2009 | Foster et al. | |
| 2009/0175477 A1 | 7/2009 | Suzuki et al. | |
| 2009/0183570 A1 | 7/2009 | Acar et al. | |
| 2009/0194829 A1 | 8/2009 | Chung et al. | |
| 2009/0263937 A1 | 10/2009 | Ramakrishna et al. | |
| 2009/0266163 A1 | 10/2009 | Ohuchi et al. | |
| 2010/0019393 A1 | 1/2010 | Hsieh et al. | |
| 2010/0024548 A1 | 2/2010 | Cardarelli | |
| 2010/0038733 A1 | 2/2010 | Minervini | |
| 2010/0044853 A1 | 2/2010 | Dekker et al. | |
| 2010/0052082 A1 | 3/2010 | Lee | |
| 2010/0058864 A1 | 3/2010 | Hsu et al. | |
| 2010/0072626 A1 | 3/2010 | Theuss et al. | |
| 2010/0089154 A1 | 4/2010 | Ballas et al. | |
| 2010/0122579 A1 | 5/2010 | Hsu et al. | |
| 2010/0155863 A1 | 6/2010 | Weekamp | |
| 2010/0206074 A1 | 8/2010 | Yoshida et al. | |
| 2010/0212425 A1 | 8/2010 | Hsu et al. | |

(56) References Cited

U.S. PATENT DOCUMENTS

| | | |
|---|---|---|
| 2010/0224004 A1 | 9/2010 | Suminto et al. |
| 2010/0236327 A1 | 9/2010 | Mao et al. |
| 2011/0030473 A1 | 2/2011 | Acar |
| 2011/0030474 A1 | 2/2011 | Kuang et al. |
| 2011/0031565 A1 | 2/2011 | Marx et al. |
| 2011/0094302 A1 | 4/2011 | Schofield et al. |
| 2011/0120221 A1* | 5/2011 | Yoda .................. 73/514.32 |
| 2011/0121413 A1 | 5/2011 | Allen et al. |
| 2011/0146403 A1* | 6/2011 | Rizzo Piazza Roncoroni et al. ................. 73/504.12 |
| 2011/0265564 A1 | 11/2011 | Acar et al. |
| 2011/0285445 A1* | 11/2011 | Huang et al. ............. 327/306 |
| 2013/0099836 A1 | 4/2013 | Shaeffer et al. |
| 2013/0139591 A1 | 6/2013 | Acar |
| 2013/0139592 A1 | 6/2013 | Acar |
| 2013/0192364 A1 | 8/2013 | Acar |
| 2013/0192369 A1 | 8/2013 | Acar et al. |
| 2013/0247666 A1 | 9/2013 | Acar |
| 2013/0247668 A1 | 9/2013 | Bryzek |
| 2013/0250532 A1 | 9/2013 | Bryzek et al. |
| 2013/0257487 A1 | 10/2013 | Opris et al. |
| 2013/0263641 A1 | 10/2013 | Opris et al. |
| 2013/0263665 A1 | 10/2013 | Opris et al. |
| 2013/0265070 A1 | 10/2013 | Kleks et al. |
| 2013/0265183 A1 | 10/2013 | Kleks et al. |
| 2013/0268227 A1 | 10/2013 | Opris et al. |
| 2013/0268228 A1 | 10/2013 | Opris et al. |
| 2013/0269413 A1 | 10/2013 | Tao et al. |
| 2013/0270657 A1 | 10/2013 | Acar et al. |
| 2013/0270660 A1 | 10/2013 | Bryzek et al. |
| 2013/0277772 A1 | 10/2013 | Bryzek et al. |
| 2013/0277773 A1 | 10/2013 | Bryzek et al. |
| 2013/0298671 A1 | 11/2013 | Acar et al. |
| 2013/0328139 A1 | 12/2013 | Acar |
| 2013/0341737 A1 | 12/2013 | Bryzek et al. |
| 2014/0070339 A1 | 3/2014 | Marx |

FOREIGN PATENT DOCUMENTS

| | | | |
|---|---|---|---|
| CN | 1905167 A | 1/2007 | |
| CN | 1948906 A | 4/2007 | |
| CN | 101038299 A | 9/2007 | |
| CN | 101180516 A | 5/2008 | |
| CN | 101239697 A | 8/2008 | |
| CN | 101270988 A | 9/2008 | |
| CN | 101426718 A | 5/2009 | |
| CN | 101813480 A | 8/2010 | |
| CN | 101858928 A | 10/2010 | |
| CN | 102597699 A | 7/2012 | |
| CN | 103209922 A | 7/2013 | |
| CN | 103210278 A | 7/2013 | |
| CN | 103221331 A | 7/2013 | |
| CN | 103221332 A | 7/2013 | |
| CN | 103221333 A | 7/2013 | |
| CN | 103221778 A | 7/2013 | |
| CN | 103221779 A | 7/2013 | |
| CN | 103221795 A | 7/2013 | |
| CN | 103238075 A | 8/2013 | |
| CN | 103363969 A | 10/2013 | |
| CN | 103363983 A | 10/2013 | |
| CN | 103364590 A | 10/2013 | |
| CN | 103364593 A | 10/2013 | |
| CN | 103368503 A | 10/2013 | |
| CN | 103368562 A | 10/2013 | |
| CN | 103368577 A | 10/2013 | |
| CN | 103376099 A | 10/2013 | |
| CN | 103376102 A | 10/2013 | |
| CN | 103403495 A | 11/2013 | |
| CN | 203275441 U | 11/2013 | |
| CN | 203275442 U | 11/2013 | |
| CN | 103663344 A | 3/2014 | |
| CN | 203719664 U | 7/2014 | |
| CN | 104094084 A | 10/2014 | |
| CN | 104105945 A | 10/2014 | |
| DE | 112011103124 T5 | 12/2013 | |
| DE | 102013014881 A1 | 3/2014 | |
| EP | 1460380 A1 | 9/2004 | |
| EP | 1521086 A1 | 4/2005 | |
| EP | 1688705 A2 | 8/2006 | |
| EP | 1832841 A1 | 9/2007 | |
| EP | 1860402 A1 | 11/2007 | |
| EP | 2053413 A1 | 4/2009 | |
| EP | 2259019 A1 | 12/2010 | |
| JP | 09089927 A | 4/1997 | |
| JP | 10239347 A | 9/1998 | |
| JP | 2005024310 A | 1/2005 | |
| JP | 2005114394 A | 4/2005 | |
| JP | 2005294462 A | 10/2005 | |
| JP | 2007024864 A | 2/2007 | |
| JP | 2008294455 A | 12/2008 | |
| JP | 2009075097 A | 4/2009 | |
| JP | 2009186213 A | 8/2009 | |
| JP | 2010025898 A | 2/2010 | |
| JP | 2010506182 A | 2/2010 | |
| KR | 1020110055449 A1 | 5/2011 | |
| KR | 1020130052652 A | 5/2013 | |
| KR | 1020130052653 A | 5/2013 | |
| KR | 1020130054441 A | 5/2013 | |
| KR | 1020130055693 A | 5/2013 | |
| KR | 1020130057485 A | 5/2013 | |
| KR | 1020130060338 A | 6/2013 | |
| KR | 1020130061181 A | 6/2013 | |
| KR | 101311966 B1 | 9/2013 | |
| KR | 1020130097209 A | 9/2013 | |
| KR | 101318810 B1 | 10/2013 | |
| KR | 1020130037462 A | 10/2013 | |
| KR | 1020130112789 A | 10/2013 | |
| KR | 1020130112792 A | 10/2013 | |
| KR | 1020130112804 A | 10/2013 | |
| KR | 1020130113385 A | 10/2013 | |
| KR | 1020130113386 A | 10/2013 | |
| KR | 1020130113391 A | 10/2013 | |
| KR | 1020130116189 A | 10/2013 | |
| KR | 1020130116212 A | 10/2013 | |
| KR | 101332701 B1 | 11/2013 | |
| KR | 1020130139914 A | 12/2013 | |
| KR | 1020130142116 A | 12/2013 | |
| KR | 101352827 B1 | 1/2014 | |
| KR | 1020140034713 A | 3/2014 | |
| TW | I255341 B | 5/2006 | |
| WO | WO-0175455 A2 | 10/2001 | |
| WO | WO-2008059757 A1 | 5/2008 | |
| WO | WO-2008087578 A2 | 7/2008 | |
| WO | WO-2009050578 A2 | 4/2009 | |
| WO | WO-2009156485 A1 | 12/2009 | |
| WO | WO-2011016859 A2 | 2/2011 | |
| WO | WO-2011016859 A3 | 2/2011 | |
| WO | WO-2012037492 A2 | 3/2012 | |
| WO | WO-2012037492 A3 | 3/2012 | |
| WO | WO-2012037501 A2 | 3/2012 | |
| WO | WO-2012037501 A3 | 3/2012 | |
| WO | WO-2012037536 A2 | 3/2012 | |
| WO | WO-2012037537 A2 | 3/2012 | |
| WO | WO-2012037538 A2 | 3/2012 | |
| WO | WO-2012037539 A1 | 3/2012 | |
| WO | WO-2012037539 A9 | 3/2012 | |
| WO | WO-2012037540 A2 | 3/2012 | |
| WO | WO-2012040194 A1 | 3/2012 | |
| WO | WO-2012040211 A2 | 3/2012 | |
| WO | WO-2012040245 A2 | 3/2012 | |
| WO | WO-2012040245 A3 | 3/2012 | |
| WO | WO-2013115967 A1 | 8/2013 | |
| WO | WO-2013116356 A1 | 8/2013 | |
| WO | WO-2013116514 A1 | 8/2013 | |
| WO | WO-2013116522 A1 | 8/2013 | |

OTHER PUBLICATIONS

"U.S. Appl. No. 12/849,742, Supplemental Notice of Allowability mailed May 5, 2014", 2 pgs.

"U.S. Appl. No. 12/849,787, Supplemental Notice of Allowability mailed Mar. 21, 2014", 3 pgs.

"U.S. Appl. No. 13/362,955, Non Final Office Action mailed Apr. 15, 2014.", 9 pgs.

(56) References Cited

OTHER PUBLICATIONS

"U.S. Appl. No. 13/363,537, Response filed Jun. 6, 2014 to Non Final Office Action mailed Feb. 6, 2014", 11 pgs.
"U.S. Appl. No. 13/742,942, Supplemental Notice of Allowability mailed Apr. 10, 2014", 2 pgs.
"U.S. Appl. No. 13/755,841, Notice of Allowance mailed May 7, 2014", 8 pgs.
"U.S. Appl. No. 13/755,841, Preliminary Amendment filed Oct. 10, 2013", 10 pgs.
"U.S. Appl. No. 13/755,841, Response filed Apr. 21, 2014 to Restriction Requirement mailed Feb. 21, 2014", 7 pgs.
"U.S. Appl. No. 13/821,589, Restriction Requirement mailed Apr. 11, 2014", 10 pgs.
"Chinese Application Serial No. 2010800423190, Office Action mailed Mar. 26, 2014", 10 pgs.
"Chinese Application Serial No. 201180053926.1, Response filed Apr. 29, 2014 to Office Action mailed Jan. 13, 2014", w/English Claims, 10 pgs.
"Chinese Application Serial No. 201180055029.4, Response filed May 27, 2014 to Office Action mailed Jan. 13, 2014", w/English Claims, 29 pgs.
"Chinese Application Serial No. 201180055309.5, Office Action mailed Mar. 31, 2014", w/English Claims, 7 pgs.
"Chinese Application Serial No. 201320172366.8, Response filed Mar. 18, 2014 to Office Action mailed Jan. 30, 2014", w/English Claims, 20 pgs.
"Chinese Application Serial No. 201320565239.4, Response filed Mar. 31, 2014 to Office Action mailed Jan. 16, 2014", w/English Claims, 38 pgs.
"European Application Serial No. 118260070.2, Office Action mailed Mar. 12, 2014", 1 pg.
"European Application Serial No. 11826070.2, Extended European Search Report mailed Feb. 21, 2014", 5 pgs.
"European Application Serial No. 11826071.0, Extended European Search Report mailed Feb. 20, 2014", 6 pgs.
"European Application Serial No. 11826071.0, Office Action mailed Mar. 12, 2014", 1 pg.
"European Application Serial No. 13001692.6, Response filed Apr. 1, 2014 to Extended European Search Report mailed Jul. 24, 2013", 19 pgs.
"European Application Serial No. 13001721.3, Response filed Apr. 7, 2014 to Extended European Search Report mailed Jul. 18, 2013", 25 pgs.
"Korean Application Serial No. 10-2013-7009777, Response filed Apr. 28, 2014", w/English Claims, 19 pgs.
"U.S. Appl. No. 12/849,742, Non Final Office Action mailed Mar. 28, 2013", 9 pgs.
"U.S. Appl. No. 12/849,742, Non Final Office Action mailed Aug. 23, 2012", 9 pgs.
"U.S. Appl. No. 12/849,787, Response filed Feb. 4, 2013 to Restriction Requirement mailed Oct. 4, 2012", 7 pgs.
"U.S. Appl. No. 12/849,787, Restriction Requirement mailed Oct. 4, 2012", 5 pgs.
"Application Serial No. PCT/US2011/052006, International Republished Application mailed Jun. 7, 2012", 1 pg.
"Application Serial No. PCT/US2011/052417, International Republished Application mailed Jun. 7, 2012", 1 pg.
"International Application Serial No. PCT/US2010/002166, International Preliminary Report on Patentability mailed Feb. 16, 2012", 6 pgs.
"International Application Serial No. PCT/US2010/002166, International Search Report mailed Feb. 28, 2011", 3 pgs.
"International Application Serial No. PCT/US2010/002166, Written Opinion mailed Feb. 28, 2011", 4 pgs.
"International Application Serial No. PCT/US2011/051994, International Search Report mailed Apr. 16, 2012", 3 pgs.
"International Application Serial No. PCT/US2011/051994, Written Opinion mailed Apr. 16, 2012", 6 pgs.
"International Application Serial No. PCT/US2011/052006, International Preliminary Report on Patentability mailed Mar. 28, 2013", 7 pgs.
"International Application Serial No. PCT/US2011/052006, Search Report mailed Apr. 16, 2012", 3 pgs.
"International Application Serial No. PCT/US2011/052006, Written Opinion mailed Apr. 16, 2012", 5 pgs.
"International Application Serial No. PCT/US2011/052059, International Preliminary Report on Patentability mailed Jan. 22, 2013", 14 pgs.
"International Application Serial No. PCT/US2011/052059, Search Report mailed Apr. 20, 2012", 4 pgs.
"International Application Serial No. PCT/US2011/052059, Written Opinion mailed Apr. 20, 2012", 7 pgs.
"International Application Serial No. PCT/US2011/052060, International Preliminary Report on Patentability mailed Jan. 22, 2013", 12 pgs.
"International Application Serial No. PCT/US2011/052060, International Search Report Apr. 20, 2012", 3 pgs.
"International Application Serial No. PCT/US2011/052060, Written Opinion mailed Apr. 20, 2012", 7 pgs.
"International Application Serial No. PCT/US2011/052061, International Preliminary Report on Patentability mailed Mar. 28, 2013", 6 pgs.
"International Application Serial No. PCT/US2011/052061, International Search Report mailed Apr. 10, 2012", 3 pgs.
"International Application Serial No. PCT/US2011/052061, Written Opinion mailed Apr. 10, 2012", 4 pgs.
"International Application Serial No. PCT/US2011/052064, International Preliminary Report on Patentability mailed Mar. 28, 2013", 5 pgs.
"International Application Serial No. PCT/US2011/052064, Search Report mailed Feb. 29, 2012", 3 pgs.
"International Application Serial No. PCT/US2011/052064, Written Opinion mailed Feb. 29, 2012", 3 pgs.
"International Application Serial No. PCT/US2011/052065, International Preliminary Report on Patentability mailed Mar. 28, 2013", 7 pgs.
"International Application Serial No. PCT/US2011/052065, International Search Report mailed Apr. 10, 2012", 3 pgs.
"International Application Serial No. PCT/US2011/052065, Written Opinion mailed Apr. 10, 2012", 5 pgs.
"International Application Serial No. PCT/US2011/052369, International Search Report mailed Apr. 24, 2012", 6 pgs.
"International Application Serial No. PCT/US2011/052369, Written Opinion mailed Apr. 24, 2012", 3 pgs.
"International Application Serial No. PCT/US2011/052417, International Preliminary Report on Patentability mailed Apr. 4, 2013", 6 pgs.
"International Application Serial No. PCT/US2011/052417, International Search Report mailed Apr. 23, 2012", 5 pgs.
"International Application Serial No. PCT/US2011/052417, Written Opinion mailed Apr. 23, 2012", 4 pgs.
Beyne, E, et al., "Through-silicon via and die stacking technologies for microsystems-integration", IEEE International Electron Devices Meeting, 2008. IEDM 2008., (Dec. 2008), 1-4.
Cabruja, Enric, et al., "Piezoresistive Accelerometers for MCM-Package-Part II", The Packaging Journal of Microelectromechanical Systems. vol. 14, No. 4, (Aug. 2005), 806-811.
Ezekwe, Chinwuba David, "Readout Techniques for High-Q Micromachined Vibratory Rate Gyroscopes", Electrical Engineering and Computer Sciences University of California at Berkeley, Technical Report No. UCB/EECS-2007-176, http://www.eecs.berkeley.edu/Pubs/TechRpts/2007/EECS-2007-176.html, (Dec. 21, 2007), 94 pgs.
Rimskog, Magnus, "Through Wafer Via Technology for MEMS and 3D Integration", 32nd IEEE/CPMT International Electronic Manufacturing Technology Symposium, 2007. IEMT '07., (2007), 286-289.
"U.S. Appl. No. 12/849,742, Notice of Allowance mailed Nov. 29, 2013", 7 pgs.
"U.S. Appl. No. 12/849,787, Notice of Allowance mailed Dec. 11, 2013", 9 pgs.

(56) References Cited

OTHER PUBLICATIONS

"U.S. Appl. No. 13/362,955, Response filed Feb. 17, 2014 to Restriction Requirement mailed Dec. 17, 2013", 9 pgs.
"U.S. Appl. No. 13/362,955, Restriction Requirement mailed Dec. 17, 2013", 6 pgs.
"U.S. Appl. No. 13/363,537, Non Final Office Action mailed Feb. 6, 2014", 10 pgs.
"U.S. Appl. No. 13/742,942, Notice of Allowance mailed Jan. 28, 2014", 9 pgs.
"U.S. Appl. No. 13/746,016, Notice of Allowance mailed Jan. 17, 2014", 10 pgs.
"U.S. Appl. No. 13/755,841, Restriction Requirement mailed Feb. 21, 2014", 6 pgs.
"Chinese Application Serial No. 201180053926.1, Office Action mailed Jan. 13, 2014", 7 pgs.
"Chinese Application Serial No. 201180054796.3, Office Action mailed Jan. 16, 2014", 8 pgs.
"Chinese Application Serial No. 201180055029.4, Office Action mailed Jan. 13, 2014", 7 pgs.
"Chinese Application Serial No. 201320172366.8, Office Action mailed Jan. 30, 2014", 3 pgs.
"Chinese Application Serial No. 201320172366.8, Office Action mailed Oct. 25, 2013", 8 pgs.
"Chinese Application Serial No. 201320172366.8, Response filed Dec. 24, 2013 to Office Action mailed Oct. 25, 2013", 11 pgs.
"Chinese Application Serial No. 201320565239.4, Office Action mailed Jan. 16, 2014", w/English Translation, 3 pgs.
"European Application Serial No. 10806751.3, Extended European Search Report mailed Jan. 7, 2014", 7 pgs.
"Korean Application Serial No. 10-2013-0109990, Amendment filed Dec. 10, 2013", 4 pgs.
"Korean Application Serial No. 10-2013-7009775, Office Action mailed Dec. 27, 2013", 8 pgs.
"Korean Application Serial No. 10-2013-7009775, Response filed Oct. 29, 2013 to Office Action mailed Sep. 17, 2013", w/English Claims, 23 pgs.
"Korean Application Serial No. 10-2013-7009777, Office Action mailed Jan. 27, 2014", 5 pgs.
"Korean Application Serial No. 10-2013-7009777, Response filed Nov. 5, 2013 to Office Action mailed Sep. 17, 2013", 11 pgs.
"Korean Application Serial No. 10-2013-7009788, Office Action mailed Dec. 27, 2013", w/English Translation, 10 pgs.
"Korean Application Serial No. 10-2013-7009788, Response filed Oct. 29, 2013 to Office Action mailed Aug. 29, 2013", w/English Claims, 22 pgs.
"U.S. Appl. No. 12/849,742, Response filed Jan. 23, 2012 to Non Final Office Action mailed Aug. 23, 2012", 10 pgs.
"U.S. Appl. No. 12/849,787, Non Final Office Action mailed May 28, 2013", 18 pgs.
"U.S. Appl. No. 12/947,543, Notice of Allowance mailed Dec. 17, 2012", 11 pgs.
"U.S. Appl. No. 13/813,443, Preliminary Amendment mailed Jan. 31, 2013", 3 pgs.
"U.S. Appl. No. 13/821,586, Preliminary Amendment mailed Mar. 8, 2013", 6 pgs.
"U.S. Appl. No. 13/821,589, Preliminary Amendment mailed Mar. 8, 2013", 6 pgs.
"U.S. Appl. No. 13/821,598, Preliminary Amendment mailed Mar. 8, 2013", 7 pgs.
"U.S. Appl. No. 13/821,609, Preliminary Amendment mailed Mar. 8, 2013", 3 pgs.
"U.S. Appl. No. 13/821,612, Preliminary Amendment mailed Mar. 8, 2013", 3 pgs.
"U.S. Appl. No. 13/821,619, Preliminary Amendment mailed Mar. 8, 2013", 3 pgs.
"U.S. Appl. No. 13/821,793, Preliminary Amendment mailed Mar. 8, 2013", 3 pgs.
"U.S. Appl. No. 13/821,842, Preliminary Amendment mailed Mar. 8, 2013", 3 pgs.
"U.S. Appl. No. 13/821,853, Preliminary Amendment mailed Mar. 8, 2013", 3 pgs.
"Application Serial No. PCT/US2011/051994, International Republished Application mailed Jun. 7, 2012", 1 pg.
"DigiSiMic™ Digital Silicon Microphone Pulse Part No. TC100E", TC100E Datasheet version 4.2 DigiSiMic™ Digital Silicon Microphone. (Jan. 2009), 6 pgs.
"EPCOS MEMS Microphone With TSV", 1 pg.
"International Application Serial No. PCT/US2011/051994, International Preliminary Report on Patentability mailed Mar. 28, 2013", 8 pgs.
"International Application Serial No. PCT/US2011/052340, International Preliminary Report on Patentability mailed Apr. 4, 2013", 5 pgs.
"International Application Serial No. PCT/US2011/052340, Search Report mailed Feb, 29, 2012", 3 pgs.
"International Application Serial No. PCT/US2011/052340, Written Opinion mailed Feb. 29, 2013", 3 pgs.
"International Application Serial No. PCT/US2011/052369, International Preliminary Report on Patentability mailed Apr. 4, 2013", 5 pgs.
"International Application Serial No. PCT/US2013/021411, International Search Report mailed Apr. 30, 2013", 5 pgs.
"International Application Serial No. PCT/US2013/021411, Written Opinion mailed Apr. 30, 2013", 5 pgs.
"International Application Serial No. PCT/US2013/023877, International Search Report mailed May 14, 2013", 3 pgs.
"International Application Serial No. PCT/US2013/023877, Written Opinion mailed May 14, 2013", 5 pgs.
"International Application Serial No. PCT/US2013/024149, Written Opinion mailed", 4 pages.
"International Application Serial No. PCT/US2013/024149, International Search Report mailed", 7 pages.
"T4020 & T4030 MEMS Microphones for Consumer Electronics", Product Brief 2010, Edition Feb. 2010, (2010), 2 pgs.
Acar, Cenk, et al., "Chapter 4: Mechanical Design of MEMS Gyroscopes", MEMS Vibratory Gyroscopes: Structural Approaches to Improve Robustness, Springer, (2009), 73-110.
Acar, Cenk, et al., "Chapter 6: Linear Multi DOF Architecture—Sections 6.4 and 6.5", MEMS Vibratory Gyroscopes: Structural Approaches to Improve Robustness, Springer, (2009), 158-178.
Acar, Cenk, et al., "Chapter 7: Torsional Multi-DOF Architecture", MEMS Vibratory Gyroscopes: Structural Approaches to Improve Robustness, Springer, (209), 187-206.
Acar, Cenk, et al., "Chapter 8: Distributed-Mass Architecture", MEMS Vibratory Gyroscopes: Structural Approaches to Improve Robustness, Springer, (2009), 207-224.
Acar, Cenk, et al., "Chapter 9: Conclusions and Future Trends", MEMS Vibratory Gyroscopes: Structural Approaches to Improve Robustness, Springer, (2009), 225-245.
Krishnamurthy, Rajesh, et al., "Drilling and Filling, but not in your Dentist's Chair A look at some recent history of multi-chip and through silicon via (TSV) technology", Chip Design Magazine, (Oct./Nov. 2008), 7 pgs.
"U.S. Appl. No. 12/849,742, Response filed Sep. 30, 2013 to Non-Final Office Action mailed Mar. 28, 2013", 12 pgs.
"U.S. Appl. No. 12/849,787, Response filed Oct. 28, 2013 to Non Final Office Action mailed May, 28, 2013", 12 pgs.
"Chinese Application Serial No. 201180053926.1, Amendment filed Aug. 21, 2013", w/English Translation, 13 pgs.
"Chinese Application Serial No. 201180055309.5, Voluntary Amendment filed Aug. 23, 2013", w/English Translation, 13 pgs.
"Chinese Application Serial No. 201320165465.3, Office Action mailed Jul. 22, 2013", w/English Translation, 2 pgs.
"Chinese Application Serial No. 201320165465.3, Response filed Aug. 7, 2013 to Office Action mailed Jul. 22, 2013", w/English Translation, 39 pgs.
"Chinese Application Serial No. 201320171504.0, Office Action mailed Jul. 22, 2013", w/English Translation, 3 pgs.
"Chinese Application Serial No. 201320171504.0, Response filed Jul. 25, 2013 to Office Action mailed Jul. 22, 2013", w/English Translation, 33 pgs.

(56) References Cited

OTHER PUBLICATIONS

"Chinese Application Serial No. 201320171616.6, Office Action mailed Jul. 10, 2013", w/English Translation, 2 pgs.
"Chinese Application Serial No. 201320171757.8, Office Action mailed Jul. 11, 2013", w/English Translation, 2 pgs.
"Chinese Application Serial No. 201320171757.8, Response filed Jul. 25, 2013 to Office Action mailed Jul. 11, 2013", w/English Translation, 21 pgs.
"Chinese Application Serial No. 201320171757.8, Response filed Jul. 25, 2013 to Office Action mailed Jul. 10, 2013", w/English Translation, 40 pgs.
"Chinese Application Serial No. 201320172128.7, Office Action mailed Jul. 12, 2013", w/English Translation, 3 pgs.
"Chinese Application Serial No. 201320172128.7, Response filed Aug. 7, 2013 to Office Action mailed Jul. 12, 2013", w/English Translation, 39 pgs.
"Chinese Application Serial No. 201320172366.8, Office Action mailed Jul. 9, 2013", w/English Translation, 3 pgs.
"Chinese Application Serial No. 201320172366.8, Response filed Sep. 16, 2013 to Office Action mailed Jul. 9, 2013", w/English Translation, 24 pgs.
"Chinese Application Serial No. 201320172367.2, Office Action mailed Jul. 9, 2013", w/English Translation, 2 pgs.
"Chinese Application Serial No. 201320172367.2, Response filed Sep. 16, 2013 to Office Action mailed Jul. 9, 2013", w/English Translation, 24 pgs.
"Chinese Application Serial No. 201320185461.1, Office Action mailed Jul. 23, 2013", w/English Translation, 3 pgs.
"Chinese Application Serial No. 201320185461.1, Response filed Sep. 10, 2013 to Office Action mailed Jul. 23, 2013", w/English Translation, 25 pgs.
"Chinese Application Serial No. 201320186292.3, Office Action mailed Jul. 19, 2013", w/English Translation, 2 pgs.
"Chinese Application Serial No. 201320186292.3, Response filed Sep. 10, 2013 to Office Action mailed Jul. 19, 2013", w/English Translation, 23 pgs.
"European Application Serial No. 13001692.6, European Search Report mailed Jul. 24, 2013", 5 pgs.
"European Application Serial No. 13001696.7, Extended European Search Report mailed Aug. 6, 2013", 4 pgs.
"European Application Serial No. 13001721.3, European Search Report mailed Jul. 18, 2013", 9 pgs.
"International Application Serial No. PCT/US2013/024138, International Search Report mailed May 24, 2013", 3 pgs.
"International Application Serial No. PCT/US2013/024138, Written Opinion mailed May 24, 2013", 4 pgs.
"Korean Application Serial No. 10-2013-7009775, Office Action mailed Sep. 17, 2013", w/English Translation, 6 pgs.
"Korean Application Serial No. 10-2013-7009777, Office Action mailed Sep. 17, 2013", w/English Translation, 8 pgs.
"Korean Application Serial No. 10-2013-7009788, Office Action mailed Aug. 29, 2013", w/English Translation, 6 pgs.
"Korean Application Serial No. 10-2013-7009790, Office Action mailed Jun. 26, 2013", W/English Translation, 7 pgs.
"Korean Application Serial No. 10-2013-7009790, Response filed Aug. 26, 2013 to Office Action mailed Jun. 26, 2013", w/English Claims, 11 pgs.
"Korean Application Serial No. 10-2013-7010143, Office Action mailed Aug. 28, 2013", w/English Translation, 5 pgs.
"Korean Application Serial No. 10-2013-7010143, Response filed Jul. 24, 2013 to Office Action mailed May 28, 2013", w/English Claims, 14 pgs.
Ferreira, Antoine, et al., "A Survey of Modeling and Control Techniques for Micro- and Nanoelectromechanical Systems", IEEE Transactions on Systems, Man and Cybernetics—Part C: Applications and Reviews vol. 41, No. 3., (May 2011), 350-364.
Fleischer, Paul E, "Sensitivity Minimization in a Single Amplifier Biquad Circuit", IEEE Transactions on Circuits and Systems. vol. Cas-23, No. 1, (1976), 45-55.

Reljin, Branimir D, "Properties of SAB filters with the two-pole single-zero compensated operational amplifier", Circuit Theory and Applications: Letters to the Editor. vol. 10, (1982), 277-297.
Sedra, Adel, et al., "Chapter 8.9: Effect of Feedback on the Amplifier Poles", Microelectronic Circuits, 5th edition, (2004), 836-864.
Song-Hee, Cindy Paik, "A MEMS-Based Precision Operational Amplifier", Submitted to the Department of Electrical Engineering and Computer Sciences MIT, [Online]. Retrieved from the Internet: <URL: http://dspace.mit.edu/bitstream/handle/1721.1/16682/57138272.pdf? . . . >, (Jan. 1, 2004), 123 pgs.
"U.S. Appl. No. 13/362,955, Final Office Action mailed Nov. 19, 2014", 5 pgs.
"U.S. Appl. No. 13/362,955, Response filed Aug. 15, 2014 to Non Final Office Action mailed May 15, 2014", 13 pgs.
"U.S. Appl. No. 13/363,537, Examiner Interview Summary mailed Sep. 29, 2014", 3 pgs.
"U.S. Appl. No. 13/363,537, Final Office Action mailed Jun. 27, 2014", 8 pgs.
"U.S. Appl. No. 13/363,537, Notice of Allowance mailed Nov. 7, 2014", 5 pgs.
"U.S. Appl. No. 13/363,537, Response filed Sep. 29, 2014 to Final Office Action mailed Jun. 27, 2014", 9 pgs.
"U.S. Appl. No. 13/742,942, Notice of Allowance mailed Jan. 28, 2014", 8 pgs.
"U.S. Appl. No. 13/755,841, Supplemental Notice of Allowability Jun. 27, 2014", 2 pgs.
"U.S. Appl. No. 13/821,586, Response filed Nov. 24, 2014 to Restriction Requirement mailed Sep. 22, 2014", 6 pgs.
"U.S. Appl. No. 13/821,586, Restriction Requirement mailed Sep. 22, 2014", 4 pgs.
"U.S. Appl. No. 13/821,589, Non Final Office Action mailed Jul. 9, 2014", 10 pgs.
"U.S. Appl. No. 13/821,589, Response filed Nov. 10, 2014 to Non Final Office Action mailed Jul. 9, 2014", 15 pgs.
"U.S. Appl. No. 13/821,589, Response to Restriction Requirement mailed Apr. 11, 2014", 6 pgs.
"U.S. Appl. No. 13/821,598, Non Final Office Action mailed Nov. 24, 2014", 9 pgs.
"U.S. Appl. No. 13/821,598, Response filed Oct. 15, 2014 to Restriction Requirement mailed Aug. 15, 2014", 8 pgs.
"U.S. Appl. No. 13/821,598, Restriction Requirement mailed Aug. 15, 2014", 11 pgs.
"U.S. Appl. No. 13/821,609, Restriction Requirement mailed Dec. 15, 2014", 7 pgs.
"U.S. Appl. No. 13/821,612, Non Final Office Action mailed Jul. 23, 2014", 8 pgs.
"U.S. Appl. No. 13/821,612, Notice of Allowance mailed Dec. 10, 2014", 8 pgs.
"U.S. Appl. No. 13/821,612, Response filed Oct. 23, 2014 to Non Final Office Action mailed Jul. 23, 2014", 6 pgs.
"U.S. Appl. No. 13/821,853, Non Final Office Action mailed Jul. 30, 2014", 10 pgs.
"U.S. Appl. No. 13/821,853, Response filed Dec. 1, 2014 to Non Final Office Action mailed Jul. 30, 2014", 10 pgs.
"Chinese Application Serial No. 2010800423190, Response filed Aug. 11, 2014 to Office Action mailed Mar. 26, 2014", w/English Claims, 11 pgs.
"Chinese Application Serial No. 201180054796.3, Office Action mailed Sep. 4, 2014", w/English Claims, 11 pgs.
"Chinese Application Serial No. 201180054796.3, Response filed Jun. 30, 2014 to Office Action mailed Jan. 16, 2014", w/English Claims, 3 pgs.
"Chinese Application Serial No. 201180054796.3, Response filed Nov. 19, 2014", with English translation of claims, 7 pgs.
"Chinese Application Serial No. 201180055029.4, Office Action mailed Jul. 2, 2014", w/English Translation, 5 pgs.
"Chinese Application Serial No. 201180055029.4, Response filed Nov. 14, 2014 to Office Action mailed Jul. 2, 2014", w/English Claims, 23 pgs.
"Chinese Application Serial No. 201180055309.5, Response filed Aug. 13, 2014 to Office Action mailed Mar. 31, 2014", w/English Claims, 27 pgs.

(56) References Cited

OTHER PUBLICATIONS

"Chinese Application Serial No. 201180055794.6, Office Action mailed Dec. 17, 2014", with English translation of claims, 9 pgs.
"Chinese Application Serial No. 201310118845.6, Office Action mailed Sep. 9, 2014", with English translation of claims, 8 pgs.
"Chinese Application Serial No. 201310119472.4, Office Action mailed Sep. 9, 2014", w/English Translation, 11 pgs.
"Chinese Application Serial No. 201380007588.7, Notification to Make Rectification mailed Aug. 18, 2014", w/English Translation, 2 pgs.
"Chinese Application Serial No. 201380007588.7, Response filed Oct. 24, 2014", with English translation, 3 pgs.
"Chinese Application Serial No. 201380007615.0, Notification to Make Rectification mailed Aug. 18, 2014", w/English Translation, 2 pgs.
"Chinese Application Serial No. 201380007615.0, Response filed Oct. 24, 2014", with English translation, 3 pgs.
"European Application Serial No. 10806751.3, Response filed Jul. 24, 2014 to Office Action mailed Jan. 24, 2014", 26 pgs.
"European Application Serial No. 11826043.9, Office Action mailed May 6, 2013", 2 pgs.
"European Application Serial No. 11826043.9, Response filed Nov. 4, 2013 to Office Action mailed May 6, 2013", 6 pgs.
"European Application Serial No. 11826067.8, Extended European Search Report mailed Oct. 6, 2014", 10 pgs.
"European Application Serial No. 11826068.6, Extended European Search Report mailed Jul. 16, 2014", 10 pgs.
"European Application Serial No. 11826070.2, Response filed Sep. 19, 2014 to Office Action mailed Mar. 12, 2014", 11 pgs.
"European Application Serial No. 11826071.0, Examination Notification Art. 94(3) mailed Dec. 11, 2014", 4 pgs.
"European Application Serial No. 11826071.0, Response filed Sep. 19, 2014 to Office Action mailed Mar. 12, 2014", 20 pgs.
"European Application Serial No. 11827347.3, Office Action mailed May 2, 2013", 6 pgs.
"European Application Serial No. 11827347.3, Response filed Oct. 30, 2013 to Office Action mailed May 2, 2013", 9 pgs.
"European Application Serial No. 11827384.6, Extended European Search Report mailed Nov. 12, 2014", 6 pgs.
"European Application Serial No. 13001695.9, European Search Report mailed Oct. 5, 2014", 6 pgs.
"European Application Serial No. 13001719.7, Extended European Search Report mailed Jun. 24, 2014", 10 pgs.
"International Application Serial No. PCT/US2013/021411, International Preliminary Report on Patentability mailed Aug. 14, 2014", 7 pgs.
"International Application Serial No. PCT/US2013/023877, International Preliminary Report on Patentability mailed Aug. 14, 2014", 7 pgs.
"International Application Serial No. PCT/US2013/024138, International Preliminary Report on Patentability mailed Aug. 14, 2014", 6 pgs.
"International Application Serial No. PCT/US2013/024149, International Preliminary Report on Patentability mailed Aug. 14, 2014", 6 pgs.
Dunn, C, et al., "Efficient linearisation of sigma-delta modulators using single-bit dither", Electronics Letters 31(12), (Jun. 1995), 941-942.
Kulah, Haluk, et al., "Noise Analysis and Characterization of a Sigma-Delta Capacitive Silicon Microaccelerometer", 12th International Conference on Solid State Sensors, Actuators and Microsystems, (2003), 95-98.
Sebastiano, Fabio, et al., "A 1.2-V 10-μW NPN-Based Temperature Sensor in 65-nm CMOS With an Inaccuracy of 0.2 C (3) From −70 C to 125 C", IEEE Journal of Solid-State Circuits, vol. 45, No. 12, Dec. 2010, (Dec. 1, 2010), 2591-2601.
Sherry, Adrian, et al., "AN-609 Application Note: Chopping on Sigma-Delta ADCs", Analog Devices, [Online]. Retrieved from the Internet: <URL: http://www.analog.com/static/imported-files/application_notes/AN-609.pdf>, (2003), 4 pgs.
Xia, Guo-Ming, et al., "Phase correction in digital self-oscillation drive circuit for improve silicon MEMS gyroscope bias stability", Solid-State and Integrated Circuit Technology (ICSICT), 2010 10th IEEE International Conference on, IEEE, (Nov. 1, 2010), 1416-1418.

* cited by examiner

MICRO-ELECTRO-MECHANICAL-SYSTEM (MEMS) DRIVER

CLAIM OF PRIORITY

This application claims the benefit of priority under 35 U.S.C. §119(e) of Tao et al., U.S. Provisional Patent Application Ser. No. 61/623,407, filed on Apr. 12, 2012, the benefit of priority of which is claimed hereby, and is incorporated by reference herein in its entirety.

OVERVIEW

This application discusses, among other things, micro-electro-mechanical systems (MEMS, and more particularly drivers for MEMS devices. In an example, a driver for a micro-electro-mechanical-system (MEMS) device can include a first input configured to receive a first command signal including an oscillatory command signal, a second input configured to receive a second command signal including a bias command signal, and an amplifier configured to receive a high voltage supply, to provide, to the MEMS device, a closed-loop output signal responsive to both the first command signal and the second command signal in a first state, and to provide an open loop output signal configured to substantially span a voltage range of the high voltage supply in a second state.

This overview is intended to provide a general overview of subject matter of the present patent application. It is not intended to provide an exclusive or exhaustive explanation of the invention. The detailed description is included to provide further information about the present patent application.

BACKGROUND

Micro-electro-mechanical-systems (MEMS) include small mechanical devices performing electrical and mechanical functions that are fabricated using photo-lithography techniques similar to techniques used to fabricate integrated circuits. Some MEMS devices are sensors that can detect motion such as an accelerometer or detect angular rate such as a gyroscope. Some MEMS gyroscopes include a driver to oscillate a proof mass of the MEMS gyroscope to allow the gyroscope to sense rotation motion.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

MEMS sensors, such as MEMS gyroscopes, can provide motion detection and measurement signals using deflections of a vibrating proof mass. The proof mass deflections can be caused by a combination of movement of the vibrating proof mass and Coriolis forces resulting from rotational motion of the gyroscope. MEMS sensors can be used in a variety of small mobile electronic devices including, but not limited to, cell phones, personal digital assistants, recreational tools, such as for hiking and camping, and game controllers. The present inventors have recognized a high voltage driver for driving a MEMS proof mass that can provide improved performance, can cost less, and can use less power.

Figure 1:
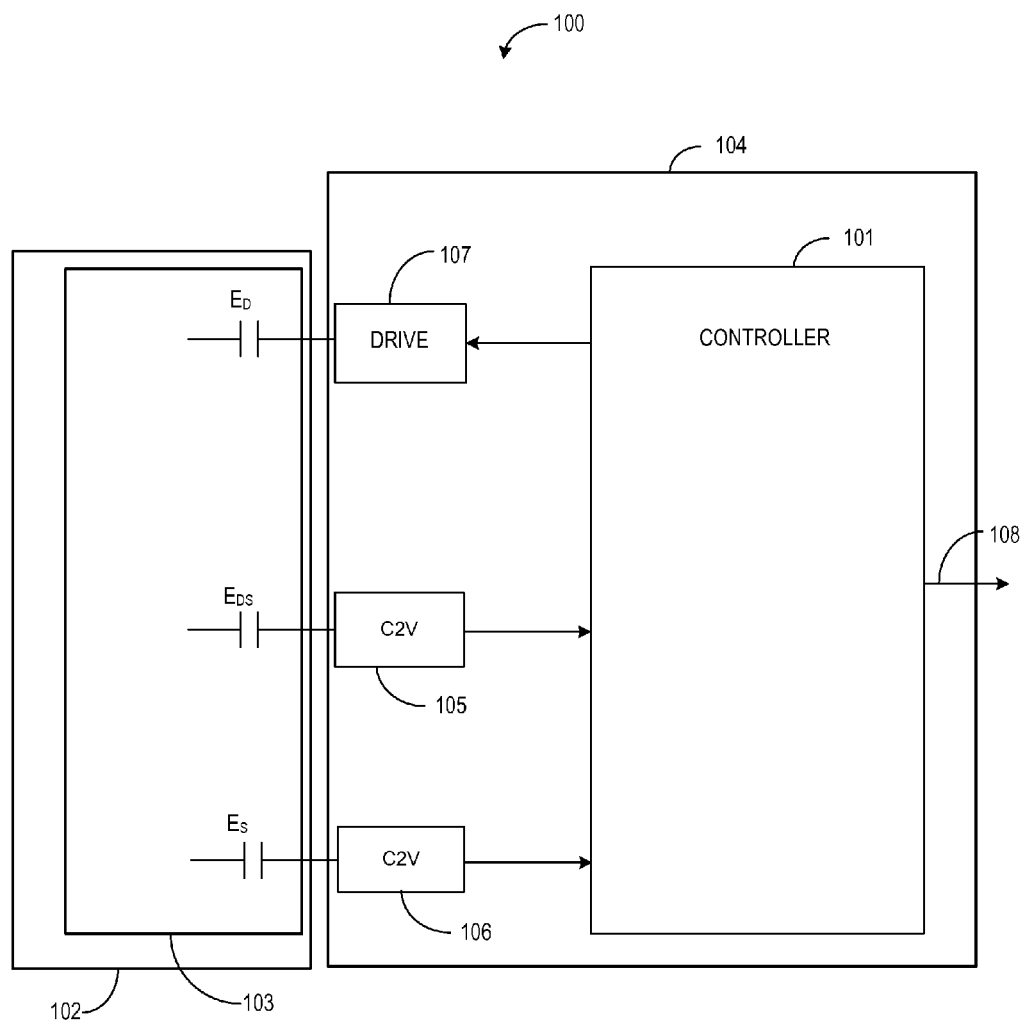
FIG. 1 illustrates generally a block diagram of an example MEMS driver integrated with a MEMS sensor system.

FIG. 1 illustrates generally a block diagram of an example MEMS driver 107 integrated with a MEMS sensor system 100. The MEMS sensor system 100, such as a MEMS gyroscope system 100 can include a MEMS gyroscope 102 including a proof mass 103, and MEMS sensor electronics 104. In certain examples, the MEMS sensor electronics 104 can include the driver 107, a drive sense current-to-voltage (C2V) converter 105, a sense C2V converter 106 and a controller 101. In some examples, the controller 101 can provide a command signal to the driver 107. The drive 107 can oscillate the proof mass of the MEMS gyroscope 102 using drive electrodes ($E_D$). Oscillations of the proof mass can affect charge on drive sense electrodes ($E_{DS}$) and the charge can be converted to voltage using the drive sense C2V converter 105. The voltage received from the drive sense C2V converter 105 can provide information about the actual oscillation of the gyroscope proof mass 103. The proof mass oscillation information can be used by the receiver to control the oscillation phase and amplitude of the proof mass including providing stable oscillation amplitude. The sense electrodes can provide an indication of deflection of one or more portions of the proof mass in response to rotational movement of the gyroscope. One or more sense C2V converters 106 can convert charge of the sense electrodes ($E_S$) to voltage. The controller can process the voltage received from the one or more sense C2V converters 106 to provide an output 108 indicative of rotational motion of the gyroscope.

Figure 2:
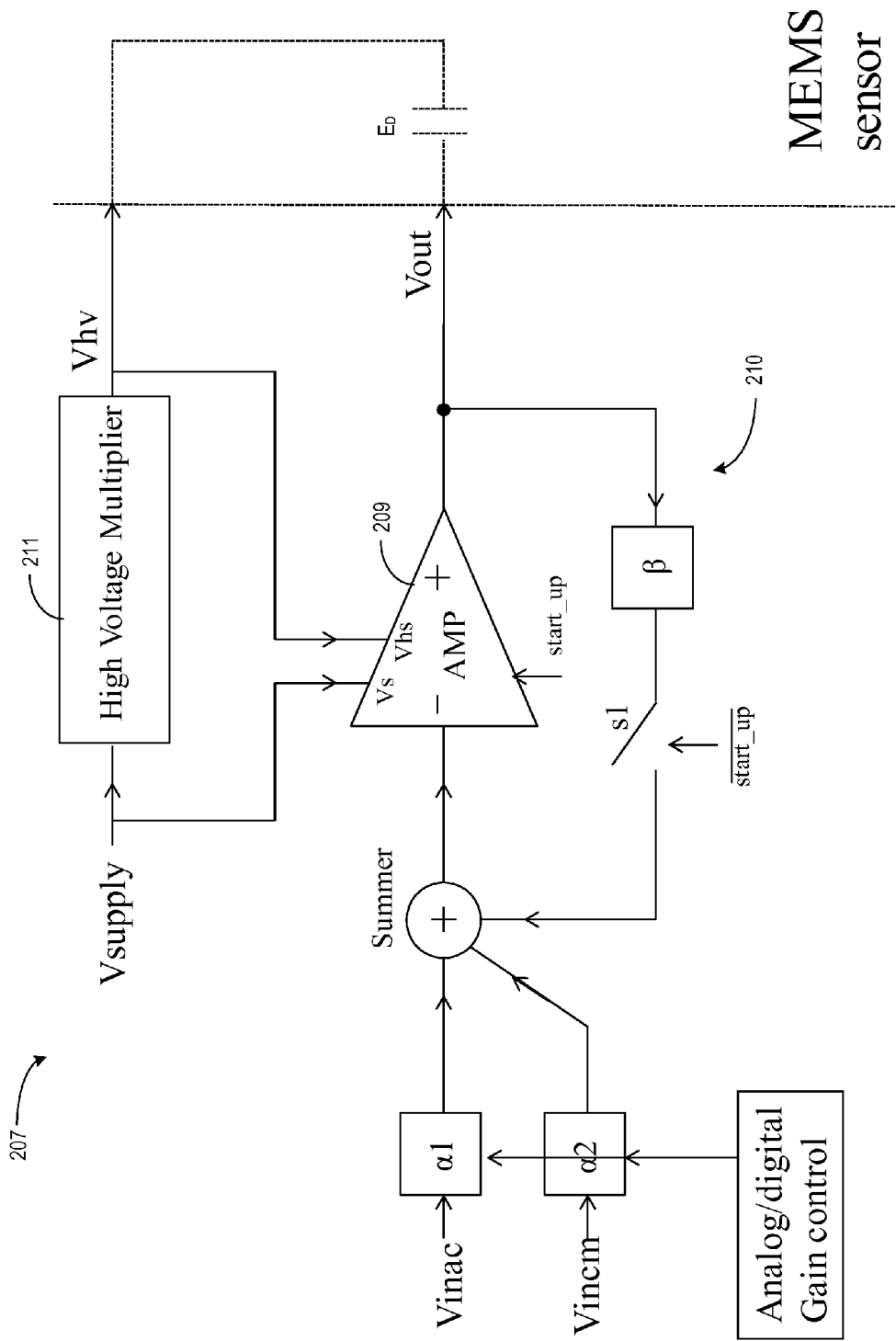
FIG. 2 illustrates generally an example MEMS driver.

FIG. 2 illustrates generally an example MEMS driver 207 that can include a first input for receiving a DC command signal (Vincm), a second input for receiving an AC command signal (Vinac), a first and second gain blocks ($\alpha 1$, $\alpha 2$), a summing junction (Summer), a high voltage amplifier 209, and a feedback path 210. In certain examples, the MEMS driver 207 can include a voltage multiplier 211. The voltage multiplier 211 can convert a supply voltage (Vsupply) to provide the high voltage (Vhs) to the high voltage amplifier 209. In certain examples, the MEMS driver 207 can respond to the received command signals (Vincm, Vinac) to modulate a drive signal (Vout) to startup and maintain controlled oscillation of a MEMS sensor proof mass. In some examples, the drive signal (Vout) can include a DC component and an AC component. In certain examples, at least one gain of the first and second gain blocks ($\alpha 1$, $\alpha 2$) can be programmable to provide flexibility in adjusting the performance of the MEMS driver 207, for example, to adjust the MEMS driver 207 to the particular MEMS sensor to be driven. In certain examples, the feedback path 210 can include a third gain block ($\beta$) to provide additional adjustment flexibility. In some examples, a gain of the third gain block ($\beta$) can be programmable.

In certain examples, the MEMS driver 207 can include a feedback switch (s1) that can be opened, in response to a state of a start-up signal (start_up), to place the drive 207 in a start-up mode. The start-up mode, for example, can allow the high voltage amplifier 209 to provide an output signal that spans the rail to rail supply voltage of the high voltage amplifier 209 without the feedback path 210 loading the amplifier output. In some examples, the high voltage amplifier 209 can provide a high, controlled, open-loop gain for providing the startup drive signal.

In certain examples, the MEMS driver 207 does not require an external component to store high-voltage supply power. In certain examples, individually adjusting the gain of the AC and DC components of the input command signals (Vincm, Vinac) can improve control of the oscillation amplitude of a MEMS proof mass and thus increase the performance of the sensor, including increasing sensor accuracy.

Figure 3:
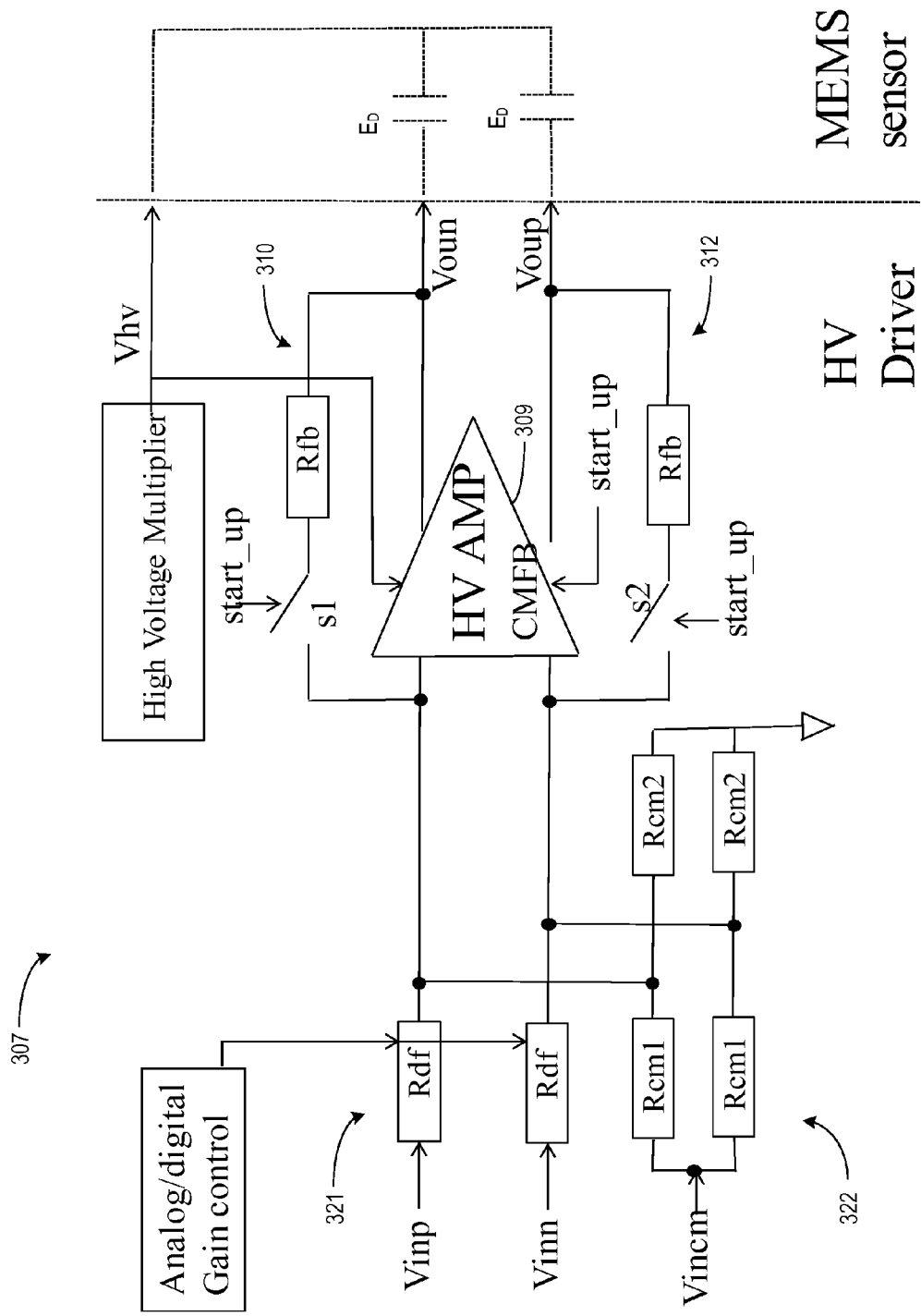
FIG. 3 illustrates generally an example MEMS driver.

FIG. 3 illustrates generally an example MEMS driver 307 that can include a first input for receiving a DC command signal (Vincm), a second differential input for receiving an AC command signal (Vinp, Vinn), first and second gain blocks 321, 322, a high voltage differential amplifier 309, and first and second feedback paths 310, 312. In certain examples, the first gain block 321, the second gain block 322 and the feedback loop gain can be set using a resistor network including Rdf, Rcm1, Rcm2, and Rfb. In some examples, the DC command signal, AC command signal and the feedback signal can be summed using the resistor network and the virtual ground of the differential, high-voltage amplifier 309. In certain examples, the feedback paths 310, 312 can include feedback switches (s1, s2) to open the feedback paths 310, 312 during a start-up mode of operation. In some examples, the feedback switches (s1, s2) can be responsive to a start-up signal (start_up) received from a controller external to the MEMS driver 307.

In certain examples, in response to a first state of the start-up signal (start_up), the feedback switches (s1, s2) can open and the high voltage amplifier 309 can generate a predetermined startup drive signal at an output (Voun, Voup). In certain examples, the predetermined start-up drive signal can include a waveform wherein the shape and phase of the waveform can be received from a component external to the MEMS driver 307. For example, the shape and phase information of the startup drive signal can be included in the signal received at the AC inputs (Vinp, Vinn) of the MEMS driver 307. In certain examples, the start-up drive signal can include a sinusoidal, square, or some other shaped waveform.

Figure 4:
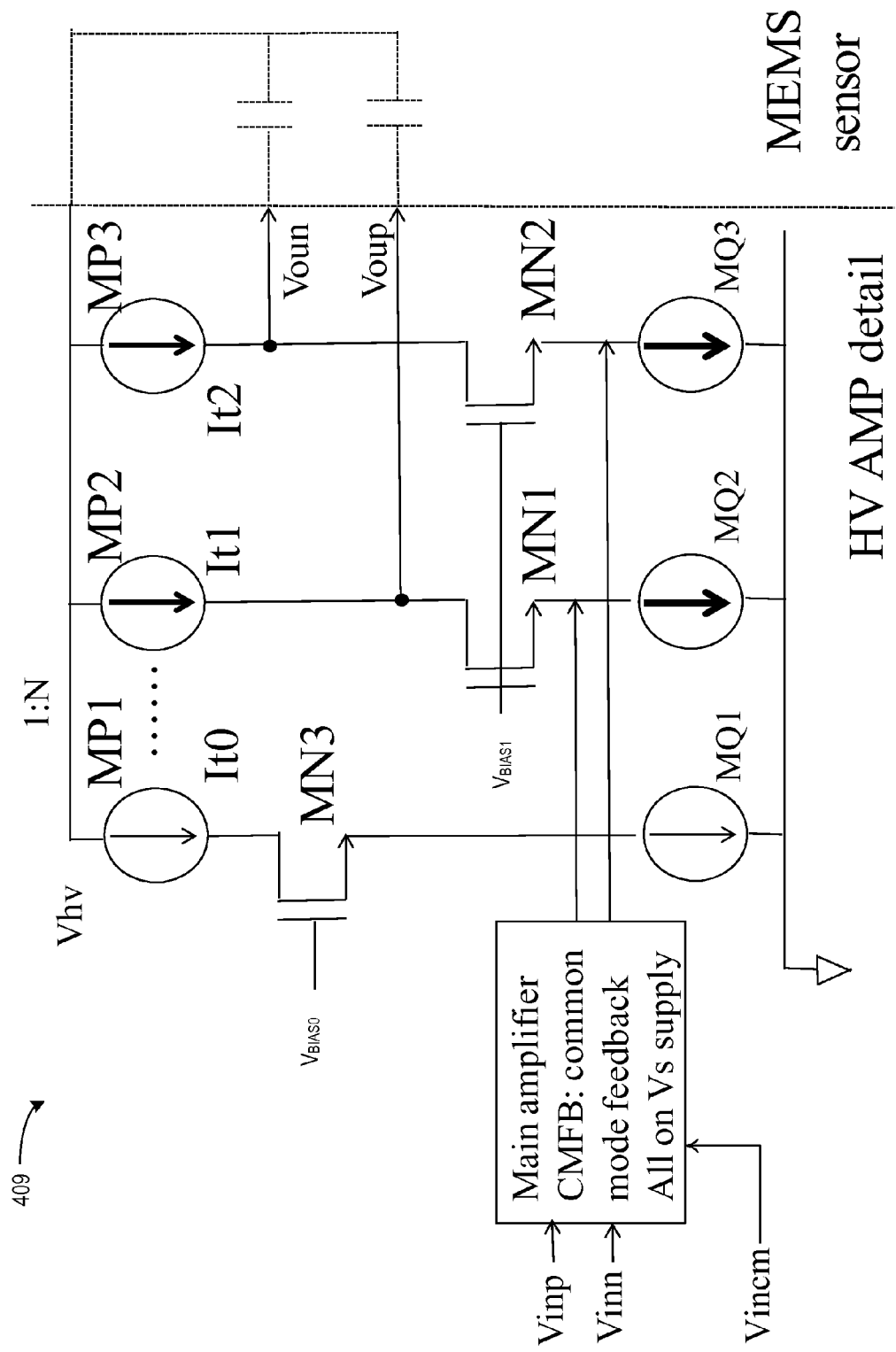
FIG. 4 illustrates generally an example high-voltage amplifier.

FIG. 4 illustrates generally an example high-voltage amplifier 409 including three high side current sources MP1, MP2, MP3, and three low-side current sources MQ1, MQ2, MQ3. In an example, in addition to providing cascode bias to the current to voltage portion of the high voltage amplifier 409, three transistors MN1, MN2, MN3 can provide a voltage shield, such that the low-side current sources MQ1, MQ2, MQ3 can use low voltage components. In certain examples, the three high-side current sources MP1, MP2, MP3 can be implemented using three high voltage transistors arranged in a current mirror such that MP1 can be a sense transistor and MP2 and MP3 can provide a mirrored current of the current sensed by MP1. In some examples, MP2 and MP3 can amplify the sensed current It0. In some examples, the high voltage transistors can be fabricated such that the source to drain structure can sustain high voltage and the gate can be of a regular voltage rating. Such construction can be less costly than transistor rated for high voltage.

In certain examples, the high voltage amplifier 409 does not include common-mode sense circuitry, thus simplifying the amplifier design and saving silicon real estate. In some examples, the three high-side current sources MP1, MP2, MP3 are fixed current sources and can be the only loads pulling power from the high voltage rail in both start-up mode and regular operation. Such an example can reduce power consumption from the high voltage supply and can simplify the voltage multiplier design, including minimizing silicon area because the upper power draw from the high voltage rail is limited to the level of the three fixed current sources. In certain examples, the high-voltage amplifier 409 can minimize power consumption from the high-voltage supply rail and can minimize overall power consumption of a MEMS sensor, such as a MEMS gyroscope. In certain examples, the open loop drive of the MEMS driver can provide fast and controlled oscillation start-up without using additional power from the high voltage supply for sophisticated start-up control functions. For example, the open loop start-up control can simplify the design of the voltage multiplier which can save silicon area and can eliminate the need for an external high voltage storage component.

Additional Notes

In Example 1, a driver for a micro-electro-mechanical-system (MEMS) device can include a first input configured to receive a first command signal including an oscillatory command signal, a second input configured to receive a second command signal including a bias command signal, and an amplifier configured to receive a high voltage supply, the amplifier configured to provide, to the MEMS device, a closed-loop output signal responsive to both the first command signal and the second command signal in a first state, and to provide an open loop output signal configured to substantially span a voltage range of the high voltage supply in a second state.

In Example 2, the driver of Example 1 optionally includes a first feedback path electrically connected to an output of the amplifier, wherein the feedback path includes a feedback switch responsive to state of a start-up signal, wherein the amplifier provides the open loop output signal when the start-up signal is in a start-up state.

In Example 3, the amplifier of any one or more of Examples 1-2 optionally is configured to provide a closed-loop output signal that is modulated by the first command signal and the second command signal when the start-up signal is in a non-start-up state.

In Example 4, the driver of any one or more of Examples 1-3 optionally includes a first gain block electrically connected to the first input and a second gain block electrically connected to the second input, wherein gain provided to the first command signal by the first gain block is independent of gain provided to the second command signal by the second gain block.

In Example 5, the driver of any one or more of Examples 1-4 optionally includes a first feedback path electrically connected to a first output of the amplifier and a second feedback path electrically connected to a second output of the amplifier, wherein the amplifier is configured to provide, to the MEMS device, a differential closed-loop output signal responsive to both the first command signal and the second command signal in the first state, and to provide a differential open loop output signal that substantially spans the voltage range of the high voltage supply in the second state.

In Example 6, the first input of any one or more of Examples 1-5 optionally is a differential first input configured to receive a first differential command signal including a differential oscillatory command signal.

In Example 7, the driver of any one or more of Examples 1-6 optionally includes a first gain block electrically connected to the differential first input and a second gain block electrically connected to the second input, wherein gain provided to the first differential command signal by the first gain block is independent of gain provided to the second command signal by the second gain block.

In Example 8, the driver of any one or more of Examples 1-7 optionally includes a first summing junction and a second summing junction electrically connected to the first differential input and configured to sum the first differential command signal and the second command signal.

In Example 9, the amplifier of any one or more of Examples 1-8 optionally includes a plurality of high side current sources and a plurality of low side current sources, wherein the high side current sources are fabricated to sustain a higher voltage than the low side current sources.

In Example 10, a method can include generating a first command signal that includes an oscillatory command signal, generating a second command signal that includes a bias command signal, providing, at an output of the driver when the driver is in a first state, a closed-loop output signal responsive to both the first command signal and the second command signal, and providing, at the output of the driver when the driver is in a second state, an open loop output signal configured to substantially span a voltage range of a high voltage supply of the driver.

In Example 11, the method of any one or more of Examples 1-10 optionally includes feeding back an output of the driver via a feedback switch, wherein the feedback switch is responsive to a state of a start-up signal, wherein the driver provides the open loop output signal when the start-up signal is in a start-up state.

In Example 12, the driver of any one or more of Examples 1-11 optionally provides a closed-loop output signal that is modulated by the first command signal and the second command signal when the start-up signal is in a non-start-up state.

In Example 13, the method of any one or more of Examples 1-12 optionally includes providing gain to the first command signal that is independent of gain provided to the second command signal.

In Example 14, the method of any one or more of Examples 1-13 optionally includes feeding back a first output of the driver via a first feedback switch and feeding back a second output of the driver via a second feedback switch, wherein the first and second feedback switches are responsive to a state of a start-up signal, providing, to the MEMS device, a differential closed-loop output signal responsive to the both the first command signal and the second command signal in the first state, and providing a differential open loop output signal that substantially spans the voltage range of the high voltage supply in the second state.

In Example 15, the generating a first command signal of any one or more of Examples 1-14 optionally includes applying, to a differential first input of the driver, a differential first command signal that includes a differential oscillatory command signal, and wherein the method further includes summing the differential first command signal and the second command signal.

In Example 16, the method of any one or more of Examples 1-15 optionally includes providing gain to the differential first command signal that is independent of gain provided to the second command signal.

In Example 17, the method of any one or more of Examples 1-16 optionally includes electrically connecting the driver to the MEMS device.

In Example 18, a system can include a MEMS device and a driver configured to provide an output signal to the MEMS device. The driver can include a first input configured to receive a first command signal including an oscillatory command signal, a second input configured to receive a second command signal including a bias command signal, and an amplifier configured to receive a high voltage supply, the amplifier configured to provide, to the MEMS device, a closed-loop output signal responsive to both the first command signal and the second command signal in a first state, and to provide an open loop output signal configured to substantially span a voltage range of the high voltage supply in a second state.

In Example 19, the MEMS device of any ne or more of Examples 1-18 optionally includes a MEMS gyroscope sensor.

In Example 20, the system of any one or more of Examples 1-19 optionally includes a first feedback path electrically connected to an output of the amplifier, wherein the feedback path includes a feedback switch responsive to state of a start-up signal, wherein the amplifier provides the open loop output signal when the start-up signal is in a start-up state.

In Example 21, the amplifier of any one or more of examples 1-20 optionally provides a closed-loop output signal that is modulated by the first command signal and the second command signal when the start-up signal is in a non-start-up state.

In Example 22, the system of any one or more of Examples 1-21 optionally includes a first gain block electrically connected to the first input and a second gain block electrically connected to the second input, wherein gain provided to the first command signal by the first gain block is independent of gain provided to the second command signal by the second gain block.

In Example 23, the system of any one or more of Examples 1-22 optionally includes a first feedback path electrically connected to a first output of the amplifier and a second feedback path electrically connected to a second output of the amplifier, wherein the amplifier is configured to provide, to the MEMS device, a differential closed-loop output signal responsive to the both the first command signal and the second command signal in the first state, and to provide a differential open loop output signal that substantially spans the voltage range of the high voltage supply in the second state.

In Example 24, the first input of any one or more of Examples 1-23 optionally is a differential first input configured to receive a first differential command signal including a differential oscillatory command signal.

In Example 25, the system of any one or more of Examples 1-24 optionally includes a first gain block electrically connected to the differential first input and a second gain block electrically connected to the second input, wherein gain provided to the first differential command signal by the first gain block is independent of gain provided to the second command signal by the second gain block.

In Example 26, the system of any one or more of Examples 1-25 optionally includes a component separate from the MEMS device and the driver, wherein the separate component is configured to provide a startup signal waveform to the first input of the driver.

Example 27 can include, or can optionally be combined with any portion or combination of any portions of any one or more of Examples 1 through 26 to include, subject matter that can include means for performing any one or more of the functions of Examples 1 through 26, or a machine-readable medium including instructions that, when performed by a machine, cause the machine to perform any one or more of the functions of Examples 1 through 26.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A driver for a micro-electro-mechanical-system (MEMS) device, the driver comprising:
   a first input configured to receive a first command signal including an oscillatory command signal;
   a second input configured to receive a second command signal including a bias command signal;
   an amplifier configured to receive a high voltage supply, the amplifier configured to provide, to the MEMS device, a closed-loop output signal responsive to both the first command signal and the second command signal in a first state, and to provide an open loop output signal configured to substantially span a voltage range of the high voltage supply in a second state;
   a first gain block electrically connected to the first input; and
   a second gain block electrically connected to the second input,
   wherein gain provided to the first command signal by the first gain block is independent of gain provided to the second command signal by the second gain block.

2. The driver of claim 1, including a first feedback path electrically connected to an output of the amplifier, wherein the feedback path includes a feedback switch responsive to state of a start-up signal, wherein the amplifier provides the open loop output signal when the start-up signal is in a start-up state.

3. The driver of claim 2, wherein the amplifier provides a closed-loop output signal that is modulated by the first command signal and the second command signal when the start-up signal is in a non-start-up state.

4. The driver of claim 1, including a first feedback path electrically connected to a first output of the amplifier and a second feedback path electrically connected to a second output of the amplifier, wherein the amplifier is configured to provide, to the MEMS device, a differential closed-loop output signal responsive to both the first command signal and the second command signal in the first state, and to provide a differential open loop output signal that substantially spans the voltage range of the high voltage supply in the second state.

5. The driver of claim 4, wherein the first input is a differential first input configured to receive a first differential command signal including a differential oscillatory command signal.

6. The driver of claim 5, including a first summing junction and a second summing junction electrically connected to the first differential input and configured to sum the first differential command signal and the second command signal.

7. The driver of claim 1, wherein the amplifier includes a plurality of high side current sources and a plurality of low side current sources, wherein the high side current sources are fabricated to sustain a higher voltage than the low side current sources.

8. The driver of claim 1, including a voltage multiplier configured to receive a voltage supply and to provide the high voltage supply, wherein a voltage of the high voltage supply is higher than a voltage of the voltage supply.

9. A method comprising:
   generating a first command signal that includes an oscillatory command signal;
   generating a second command signal that includes a bias command signal;

providing, at an output of the driver when the driver is in a first state, a closed-loop output signal responsive to both the first command signal and the second command signal;

providing, at the output of the driver when the driver is in a second state, an open loop output signal configured to substantially span a voltage range of a high voltage supply of the driver; and providing gain to the first command signal that is independent of gain provided to the second command signal.

10. The method of claim 9, including feeding back an output of the driver via a feedback switch, wherein the feedback switch is responsive to a state of a start-up signal, wherein the driver provides the open loop output signal when the start-up signal is in a start-up state.

11. The method of claim 10, wherein the driver provides a closed-loop output signal that is modulated by the first command signal and the second command signal when the start-up signal is in a non-start-up state.

12. The method of claim 9, including:
feeding back a first output of the driver via a first feedback switch and feeding back a second output of the driver via a second feedback switch, wherein the first and second feedback switches are responsive to a state of a start-up signal;
providing, to the MEMS device, a differential closed-loop output signal responsive to the both the first command signal and the second command signal in the first state; and
providing a differential open loop output signal that substantially spans the voltage range of the high voltage supply in the second state.

13. The method of claim 12, wherein generating a first command signal includes applying, to a differential first input of the driver, a differential first command signal that includes a differential oscillatory command signal, and wherein the method further includes summing the differential first command signal and the second command signal.

14. The method of claim 9, including electrically connecting the driver to the MEMS device.

15. The method of claim 9, including:
receiving a voltage supply at a voltage multiplier of a driver for a micro-electro-mechanical-system (MEMS) device; and
providing the high voltage supply using the voltage multiplier and the voltage supply, wherein a voltage of the high voltage supply is higher than a voltage of the voltage supply.

16. A system comprising:
a MEMS device; and
a driver configured to provide an output signal to the MEMS device, wherein the driver includes:
a first input configured to receive a first command signal including an oscillatory command signal;
a second input configured to receive a second command signal including a bias command signal;
an amplifier configured to receive a high voltage supply, the amplifier configured to provide, to the MEMS device, a closed-loop output signal responsive to both the first command signal and the second command signal in a first state, and to provide an open loop output signal configured to substantially span a voltage range of the high voltage supply in a second state;
a first gain block electrically connected to the first input; and
a second gain block electrically connected to the second input,
wherein gain provided to the first command signal by the first gain block is independent of gain provided to the second command signal by the second gain block.

17. The system of claim 16, wherein the MEMS device includes a MEMS gyroscope sensor.

18. The system of claim 16, including a first feedback path electrically connected to an output of the amplifier, wherein the feedback path includes a feedback switch responsive to state of a start-up signal, wherein the amplifier provides the open loop output signal when the start-up signal is in a start-up state.

19. The system of claim 18, wherein the amplifier provides a closed-loop output signal that is modulated by the first command signal and the second command signal when the start-up signal is in a non-start-up state.

20. The system of claim 16, including a first feedback path electrically connected to a first output of the amplifier and a second feedback path electrically connected to a second output of the amplifier, wherein the amplifier is configured to provide, to the MEMS device, a differential closed-loop output signal responsive to the both the first command signal and the second command signal in the first state, and to provide a differential open loop output signal that substantially spans the voltage range of the high voltage supply in the second state.

21. The system of claim 20, wherein the first input is a differential first input configured to receive a first differential command signal including a differential oscillatory command signal.

22. The system of claim 16, including a component separate from the MEMS device and the driver, wherein the separate component is configured to provide a startup signal waveform to the first input of the driver.

23. The system of claim 16, wherein the driver includes a voltage multiplier configured to receive a voltage supply and to provide the high voltage supply, wherein a voltage of the high voltage supply is higher than a voltage of the voltage supply.

* * * * *